United States Patent
La Rosa et al.

(10) Patent No.: US 7,529,145 B2
(45) Date of Patent: May 5, 2009

(54) METHOD FOR READING ELECTRICALLY PROGRAMMABLE AND ERASABLE MEMORY CELLS, WITH BIT LINE PRECHARGE-AHEAD

(75) Inventors: Francesco La Rosa, Rousset (FR); Thierry Giovinazzi, Aix En Provence (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 11/212,480

(22) Filed: Aug. 25, 2005

(65) Prior Publication Data

US 2006/0067129 A1    Mar. 30, 2006

(30) Foreign Application Priority Data

Aug. 26, 2004   (FR) .................................. 04 09108

(51) Int. Cl.
G11C 7/00 (2006.01)
G11C 8/00 (2006.01)
G11C 11/34 (2006.01)

(52) U.S. Cl. ............. 365/203; 365/189.08; 365/189.12; 365/230.06; 365/185.21; 365/185.25

(58) Field of Classification Search ................. 365/203, 365/205, 207, 208, 230.06, 185.25, 185.21, 365/185.23, 185.33, 189.08, 189.12
See application file for complete search history.

(56) References Cited

U.S. PATENT DOCUMENTS

| | | | | |
|---|---|---|---|---|
| 4,208,730 A | * | 6/1980 | Dingwall et al. ............. | 365/203 |
| 4,725,986 A | * | 2/1988 | Kouba ......................... | 365/203 |
| 5,056,063 A | * | 10/1991 | Santin et al. ............ | 365/185.25 |
| 5,323,351 A | * | 6/1994 | Challa .................... | 365/185.33 |
| 5,386,150 A | * | 1/1995 | Yonemoto ................... | 365/203 |
| 5,408,438 A | * | 4/1995 | Tanaka et al. ............... | 365/203 |
| 5,663,922 A | | 9/1997 | Tailliet ...................... | 365/240 |
| 5,765,214 A | * | 6/1998 | Sywyk ........................ | 365/203 |
| 5,790,466 A | | 8/1998 | Hotta .......................... | 365/203 |
| 5,815,450 A | * | 9/1998 | Kimura ....................... | 365/203 |
| 6,157,577 A | * | 12/2000 | McPartland ............ | 365/189.03 |
| 6,172,922 B1 | * | 1/2001 | Suzuki ........................ | 365/203 |
| 6,240,049 B1 | * | 5/2001 | Inoue ........................... | 365/203 |
| 6,272,049 B1 | * | 8/2001 | Maruyama et al. ...... | 365/185.25 |
| 6,282,137 B1 | * | 8/2001 | Lee et al. ................ | 365/185.25 |

(Continued)

FOREIGN PATENT DOCUMENTS

EP        0712133 A1    5/1996

(Continued)

*Primary Examiner*—Trong Phan
(74) *Attorney, Agent, or Firm*—Lisa K. Jorgenson; Thomas J. Satagaj; Seed IP Law Group PLLC (57) ABSTRACT

The present invention relates to a method for reading memory cells by means of sense amplifiers, the memory cells being linked to bit lines, the reading of each memory cell comprising a phase of precharging the bit line to which the memory cell is linked and a phase of actually reading the memory cell. According to the present invention, each sense amplifier is used to precharge at least two bit lines, then to read one memory cell in one of the precharged bit lines. The present invention applies particularly to serial memories, for the precharge-ahead of bit lines having the same partial address, while a read address is being received.

42 Claims, 7 Drawing Sheets

U.S. PATENT DOCUMENTS

| | | | | |
|---|---|---|---|---|
| 6,438,024 | B1 * | 8/2002 | Gold et al. | 365/203 |
| 6,724,673 | B2 * | 4/2004 | Covarel et al. | 365/203 |
| 6,760,265 | B2 * | 7/2004 | La Rosa | 365/207 |
| 6,847,555 | B2 * | 1/2005 | Toda | 365/185.21 |
| 6,891,772 | B2 * | 5/2005 | Demone | 365/203 |
| 6,954,371 | B2 * | 10/2005 | Hokari et al. | 365/203 |
| 7,009,886 | B1 * | 3/2006 | Berger et al. | 365/185.25 |
| 7,123,528 | B2 * | 10/2006 | Jeong et al. | 365/230.06 |
| 2003/0109096 | A1 | 6/2003 | Otani et al. | 438/200 |

FOREIGN PATENT DOCUMENTS

EP    1172820 A1    1/2002

* cited by examiner

METHOD FOR READING ELECTRICALLY PROGRAMMABLE AND ERASABLE MEMORY CELLS, WITH BIT LINE PRECHARGE-AHEAD

BACKGROUND OF THE INVENTION

1. Field of the Invention

The present invention relates to electronic memories and particularly to electrically programmable and erasable memories, particularly EEPROM (Electrically-Erasable Programmable Read-Only Memory) memories and Flash memories (Flash-EEPROM).

The present invention relates to the reading of binary words in such memories and more particularly in serial input/output memories.

2. Description of the Related Art

In EP patent no. 712 133, the applicant has already explained the problem encountered with serial memories, due to the fact that it is almost impossible to provide sense amplifiers adapted to the rates imposed by synchronous-type serial buses. Indeed, the time Tr allowed for a binary word to be read in a serial access memory runs from the instant the last address bit is received by the memory to the instant the first bit of the word designated by said address is sent by the memory.

As an address bit is generally read in the middle of a clock period, and a data bit sent at the start of a clock period, the time Tr is at the minimum equal to half a clock period. In practice, the time Tr is on the order of 1.5 clock periods with an I²C (Inter-Integrated Circuit) type bus (a pause of one clock cycle being allowed between the receipt of the last address bit and the sending of the first bit of the word read), of 1 clock period with a Microwire-type bus, and on the order of 0.5 clock period with an SPI (Serial Peripheral Interface) type bus, which is the worst case as far as memory reading rapidity requirements are concerned.

Figures 1A, 1B:
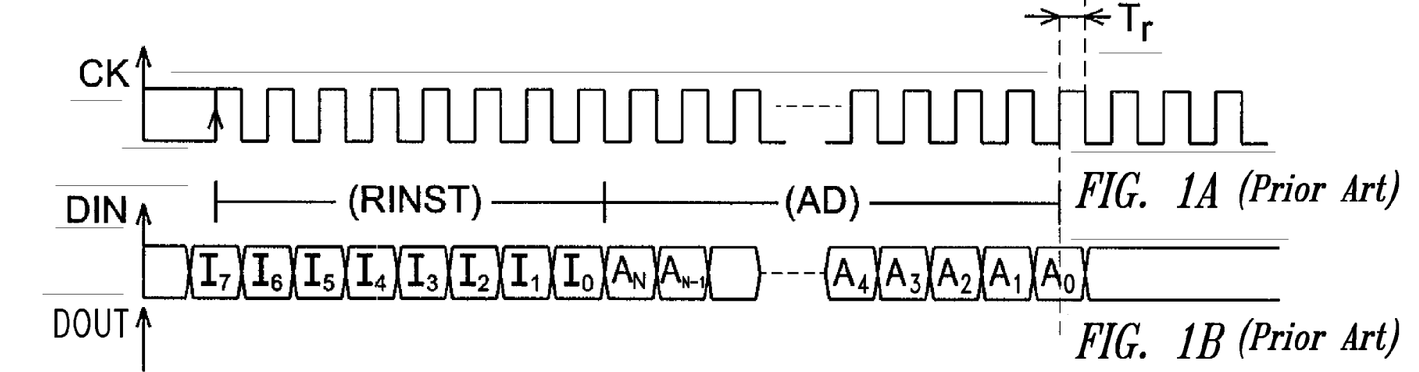
FIGS. 1A, 1B, 1C described above illustrate an operation of reading a serial memory and respectively represent an incoming clock signal, incoming data, and outgoing data.
Figure 1C:
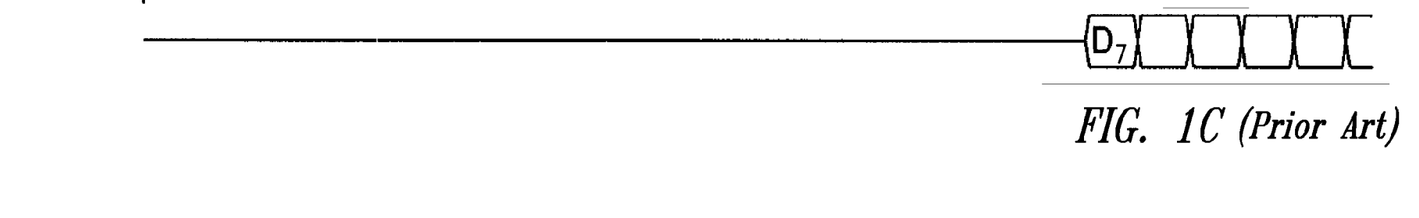

For a better understanding, a sequence of reading a binary word in a serial memory is shown in FIGS. 1A, 1B, 1C. FIG. 1A represents a clock signal CK applied to the memory, FIG. 1B represents data bits DIN applied to the memory, and FIG. 1C represents the data bits DOUT supplied by the memory. First, the memory receives data bits $I_7, I_6 \ldots I_0$ forming a read instruction (RINST) then bits $A_N, A_{N-1}, \ldots A_2, A_1, A_0$ forming the address (AD) of the binary word to be read from the serial memory. The last address bit $A_0$ is received at an instant $t_1$, corresponding to the rising edge of a pulse of the clock signal CK. At an instant $t_2$ corresponding to the falling edge of the same clock pulse (SPI type bus), the first bit $D_7$ of the word read designated by the address received must be supplied as an outgoing datum DOUT. $T_r$, the read time, is thus equal to $t_2-t_1$ and here is equal to half a clock cycle. During time $T_r$, the address received must be applied to an address decoder of the serial memory, the word designated by the address received (AD) must be read, loaded into an output register with parallel input and serial output, and a shift signal must be applied to the output register so that the first bit $D_7$ of the word read is sent.

Moreover, the clock frequency of serial buses has constantly increased in recent years. Some ten years ago it was on the order of 1 MHz, i.e., a clock period in the order of one microsecond, which would allow a reading time $T_r$ on the order of 0.5 microseconds in the worst case (SPI type bus). It is often on the order of 20 MHz at present, i.e., a clock period of 50 nanoseconds and a short reading time $T_r$ on the order of 25 nanoseconds.

To overcome this disadvantage, EP patent no. 712 133 describes a reading method involving triggering a read operation before all of the address bits have been received, which involves simultaneously reading M binary words having the same partial address (address being received the least significant address bits of which are not yet known). As the address bits are received at the pace of the clock signal, the time saved is equal to the period of the clock signal multiplied by the number N of address bits read ahead.

The disadvantage of this read-ahead method is that it requires providing a greater number of sense amplifier circuits than in a conventional memory. Thus, sixteen sense amplifier circuits instead of eight must be provided for a two-byte read-ahead, thirty-two sense amplifier circuits must be provided instead of eight for a four-byte read-ahead, etc.

In EP patent no. 1 172 820, this problem is identified and a method reducing the number of sense amplifiers required for a read-ahead is proposed. Very schematically, this method involves reading ahead only one part of the binary words having the same partial address. On the other hand, this partial read-ahead method requires a quite complex interlinking of the bit lines in the memory array, so that a same sense amplifier can read two bits of different ranks in the same binary word and two different sense amplifiers can simultaneously read two bits of the same rank of two binary words having identical partial addresses.

BRIEF SUMMARY OF THE INVENTION

The present invention aims to provide a reading method applicable to a serial memory, whereby memory cells can be rapidly read as soon as the last address bit is received.

The present invention recognizes that the process of reading a memory cell classically comprises two distinct phases: a phase of precharging a bit line to which the memory cell to be read is linked, and a phase of actually reading the memory cell. Such a phase of precharging the bit line enables the bit line to be taken to a determined read voltage, generally on the order of 1V, forming the drain-source voltage of a floating-gate transistor of the memory cell to be read. Such a precharge phase has been considered necessary due to stray capacitances present on the bit line, particularly the drain capacitances of the memory cells linked to the bit line, the capacitances of the metal contacts present on the bit line, the stray capacitance of the bit line itself, etc.

Now, according to observations on which the present invention is based, the duration of the precharge phase is quite significant compared to the duration of the phase of actually reading a memory cell. The precharging of a bit line typically represents 50% to 80% of the global reading time of a memory cell.

Thus, one principle of the present invention is to use a same sense amplifier to precharge several bit lines. Then, when the actual reading phase is triggered, the sense amplifier is used to read only one memory cell that is on one of the precharged bit lines. Such a reading method can be advantageously applied to a serial memory and thus comprises precharging bit lines having the same partial address with the same sense amplifier, then, when the complete address is known, reading the memory cells designated by the complete address. As the corresponding bit lines are already precharged, at least partially, when the complete address is known, the actual reading of the memory cells can be done in the short time imposed by the serial communication protocol, i.e., 0.5 or 1.5 clock cycles according to the aforementioned examples.

More particularly, the present invention provides a method for reading memory cells by means of sense amplifiers, the memory cells being linked to bit lines, the reading of each memory cell comprising a phase of precharging the bit line to which the memory cell is linked and a phase of actually reading the memory cell, wherein each sense amplifier is used to precharge at least two bit lines, then to read one memory cell on one of the precharged bit lines.

According to one embodiment, each sense amplifier is linked to a group of bit lines through a column decoder, and the decoder is used to link each sense amplifier to at least two bit lines during the precharge phase, then, during the reading phase, to link each sense amplifier to one bit line.

According to one embodiment, the column decoder comprises decoder blocks driven by predecoding signals supplied by a predecoder stage receiving a column address, each decoder block linking a sense amplifier to a group of bit lines, and the method comprises a step of forcing the predecoder, during the precharging of bit lines, to supply predecoding signals of determined value, so that each decoder block links a sense amplifier to at least two bit lines, then, during the reading phase, releasing the predecoder so that each column decoder block links a sense amplifier to one bit line.

According to one embodiment, the method is applied to a serial memory receiving a read address bit by bit and comprises the following steps: upon receiving a partial read address from which at least one least significant bit is missing, precharging bit lines having the same partial address by using a sense amplifier to precharge at least two bit lines, and upon receiving the complete address, stopping precharging of the bit lines that are not designated by the complete address, and reading the memory cells designated by the complete address.

According to one embodiment, the bit lines designated by the complete address continue to be precharged after the complete address has been received, before beginning the actual reading of the memory cells designated by the complete address.

According to one embodiment, the method comprises the following steps: upon receiving a first partial read address from which at least two least significant bits are missing, precharging the bit lines having the same partial address, and upon receiving the next address bit forming a second partial address with the first partial address, stopping precharging of bit lines that are not designated by the second partial address, so as to reduce the capacitive load seen by the sense amplifiers and to accelerate the precharging of the remaining selected bit lines.

The present invention further relates to a memory comprising memory cells linked to bit lines, sense amplifiers and a column decoder linking each sense amplifier to a group of bit lines, wherein the reading of memory cells comprises a phase of precharging, by the sense amplifiers, the bit lines to which the memory cells to be read are linked, and a phase of actually reading the memory cells with the sense amplifiers, the memory comprising means for forcing the decoder, during the precharge phase, to link each sense amplifier to at least two bit lines of a column, then, during the reading phase, releasing the decoder so that it links each sense amplifier to one bit line of the column.

According to one embodiment, the column decoder comprises decoder blocks driven by predecoding signals supplied by a predecoder stage receiving a column address, each decoder block linking a sense amplifier to a group of bit lines, and the memory comprises means for forcing the predecoder, in precharge phase, to supply predecoding signals of determined value, so that each column decoder block links a sense amplifier to at least two bit lines, then, during the reading phase, releasing the predecoder so that each decoder block links a sense amplifier to one bit line.

According to one embodiment, the memory comprises a serial input and receives a read address bit by bit, and means for: upon receiving a partial read address from which at least one least significant bit is missing, precharging bit lines having the same partial address in each group of bit lines, and upon receiving the complete address, stopping precharging of the bit lines that are not designated by the complete address, then reading the memory cells designated by the complete address.

According to one embodiment, the memory is arranged for continuing to precharge the bit lines designated by a complete address upon receiving the complete address, before triggering the actual reading of the memory cells designated by the complete address.

According to one embodiment, the memory comprises means for: upon receiving a first partial read address from which at least two least significant bits are missing, precharging bit lines having the same partial address in each group of bit lines, and upon receiving the next address bit forming a second partial address with the first partial address, stopping precharging of bit lines that are not designated by the second partial address.

BRIEF DESCRIPTION OF THE SEVERAL VIEWS OF THE DRAWINGS

These and other objects, features and advantages of the present invention will be explained in greater detail in the following description of the reading method according to the present invention and of an example of an embodiment of a serial memory implementing this method, given in relation with, but not limited to the following figures.

DETAILED DESCRIPTION OF THE INVENTION

Figure 2:
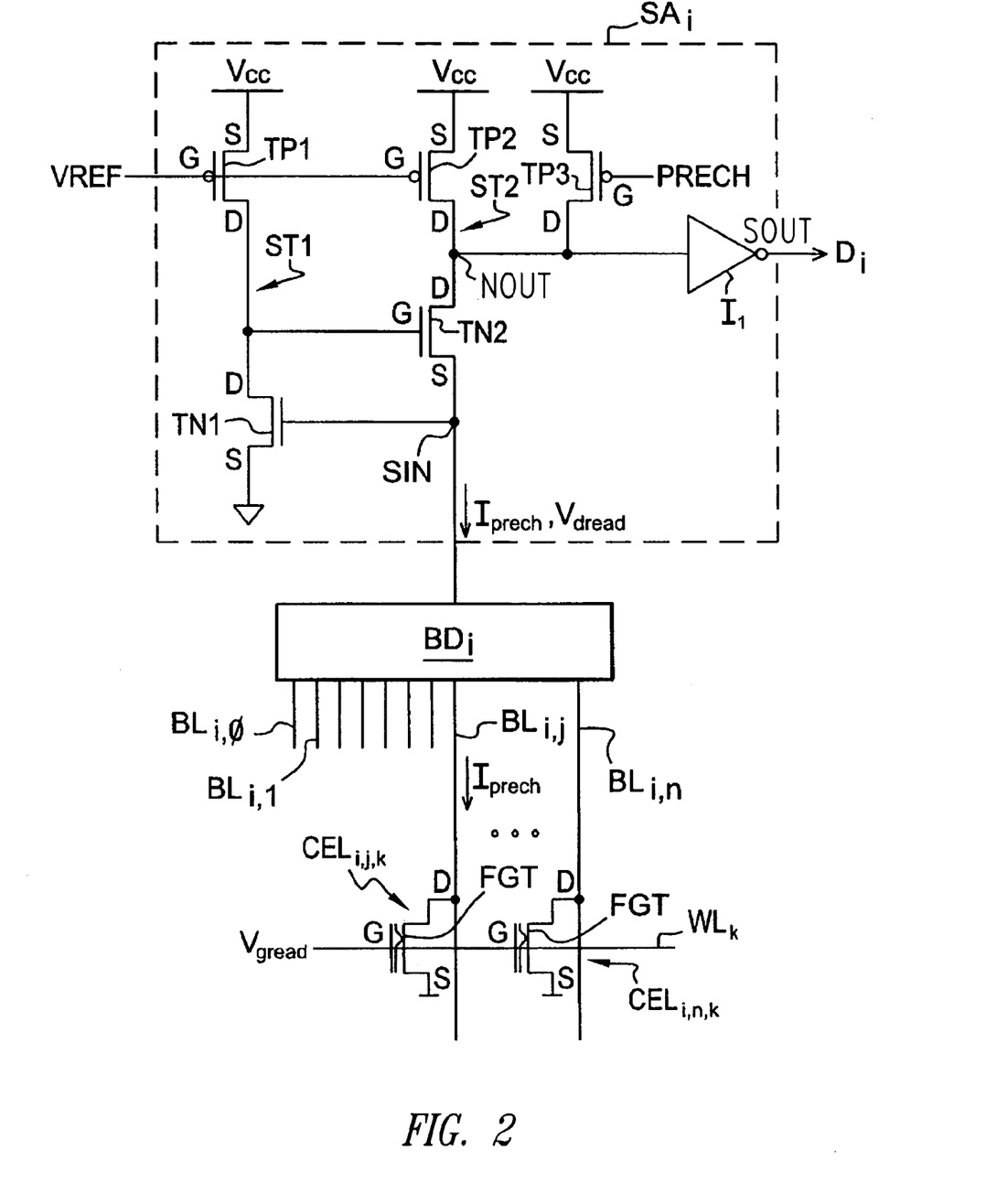
FIG. 2 is a wiring diagram of a sense amplifier linked to bit lines by a column decoder.

FIG. 2 illustrates a sense amplifier $SA_i$ structure arranged in an electrically erasable and programmable memory. The amplifier comprises a sense in node SIN and an output SOUT ("Sense Out"). The sense in node SIN is linked to the output of a decoding block BDi comprising n inputs linked to n bit lines $BL_{i,0}$, $BL_{i,1}$ ... $BL_{1,j}$ ... $BL_{i,n}$ forming a group of bit lines or column of a memory array. Each bit line is linked to a plurality of memory cells $CEL_{i,j,k}$ (only one being represented in FIG. 2). Each memory cell $CEL_{i,j,k}$ comprises a floating-gate transistor FGT the gate of which is linked to a word line $WL_k$ of rank k and the drain of which is directly linked to the bit line $BL_{i,j}$ (Flash-type memory cell). A memory $CEL_{j,n,k}$ is also shown coupled to bit line $BL_{i,n}$ and word line k.

The sense amplifier $SA_i$ comprises two conductive branches ST1, ST2 arranged in current mirror configuration. The branch ST1 comprises a PMOS transistor TP1 and an NMOS transistor TN1 in series. The branch ST2 comprises a PMOS transistor TP2 and an NMOS transistor TN2 in series. The transistors TP1, TP2 receive a voltage Vcc at their source and a reference voltage VREF at their gate. The drain of the transistor TP2 is linked to the drain of the transistor TN2, the drain of the transistor TP1 is linked to the gate of the transistor TN2 and to the drain of the transistor TN1 the source of which is linked to the ground. The source of the transistor TN2, forming the sense in node SIN, is linked to the gate of the transistor TN1. The node common to the drains of the transistors TP2, TN2 forms an output node NOUT that is applied to an inverting gate $I_1$ the output of which forms the output SOUT of the sense amplifier.

The sense amplifier further comprises a PMOS precharge transistor TP3. The source of this transistor receives the voltage Vcc, its drain is linked to the node NOUT and its gate is driven by a signal PRECH. The precharge transistor TP3 generally has a sufficiently high gate width to length ratio (W/L) so that the node SIN can rapidly take the bit line to a read voltage $V_{dread}$, by supplying a sufficient precharge current $I_{prech}$ to counter the presence of stray capacitances.

In previous practices, the reading of a memory cell, such as the cell $CEL_{i,j,k}$ represented in FIG. 2 for example, comprises the following steps:

selecting the bit line $BL_{j,k}$ by means of the decoding block $BD_i$, so that the sense in node SIN of the amplifier $SA_i$ is linked to the selected bit line $BL_{j,k}$,
  precharging the selected bit line $BL_{j,k}$ by means of the amplifier $SA_i$, by taking the signal PRECH to 0 so that the transistor TP3 is on, and
  reading the memory cell, by taking the signal PRECH to 1 and by applying a read voltage $V_{gread}$ to the gate of the memory cell $CEL_{i,j,k}$, a datum $D_i$ then being supplied by the output SOUT of the amplifier $SA_i$.

When the precharge phase is completed, the voltage $V_{dread}$ applied to the bit line, generally on the order of 1V, forms the drain-source voltage of the floating-gate transistor FGT. If the memory cell is in the erased state (threshold voltage of the transistor FGT lower than Vgread) the transistor FGT is on and the node NOUT is pulled to 0, the output SOUT then supplying the datum $D_i=1$. If the memory cell is in the programmed state (threshold voltage of the transistor FGT higher than Vgread), the transistor FGT is off and the node NOUT remains on the voltage Vcc (forming the logic "1"), the output DOUT then supplying the datum $D_i=0$.

According to the present invention, the sense amplifier $SA_i$ is used to precharge at least two bit lines and the reading of a memory cell then comprises the following steps:

two bit lines, for example $BL_{i,j}$ and $BL_{i,n}$, are selected by means of the decoding block $BD_i$, such that the sense in node SIN of the amplifier $SA_i$ is linked to these two bit lines,
  the signal PRECH is taken to 1 and the two bit lines are precharged by the amplifier $SA_i$ (the W/L ratio of the precharge transistor TP3 being chosen accordingly),
  one bit line out of the two selected, such as the bit line $BL_{i,n}$ for example, is disconnected from the sense in node SIN by the decoding block $BD_i$, and
  the memory cell on the remaining bit line, such as the memory cell $CEL_{i,j,k}$ for example, is read in a conventional manner with the signal PRECH at 1 and by reading the datum $D_i$ supplied by the output of the sense amplifier.

Such a reading method, comprising precharging two bit lines instead of one with the same sense amplifier, can be advantageously applied to serial memories and enables a precharge-ahead of bit lines having the same partial address to be performed.

This will be better understood in the light of the following description of an example of application of the method of the present invention to a serial memory.

Figure 3:
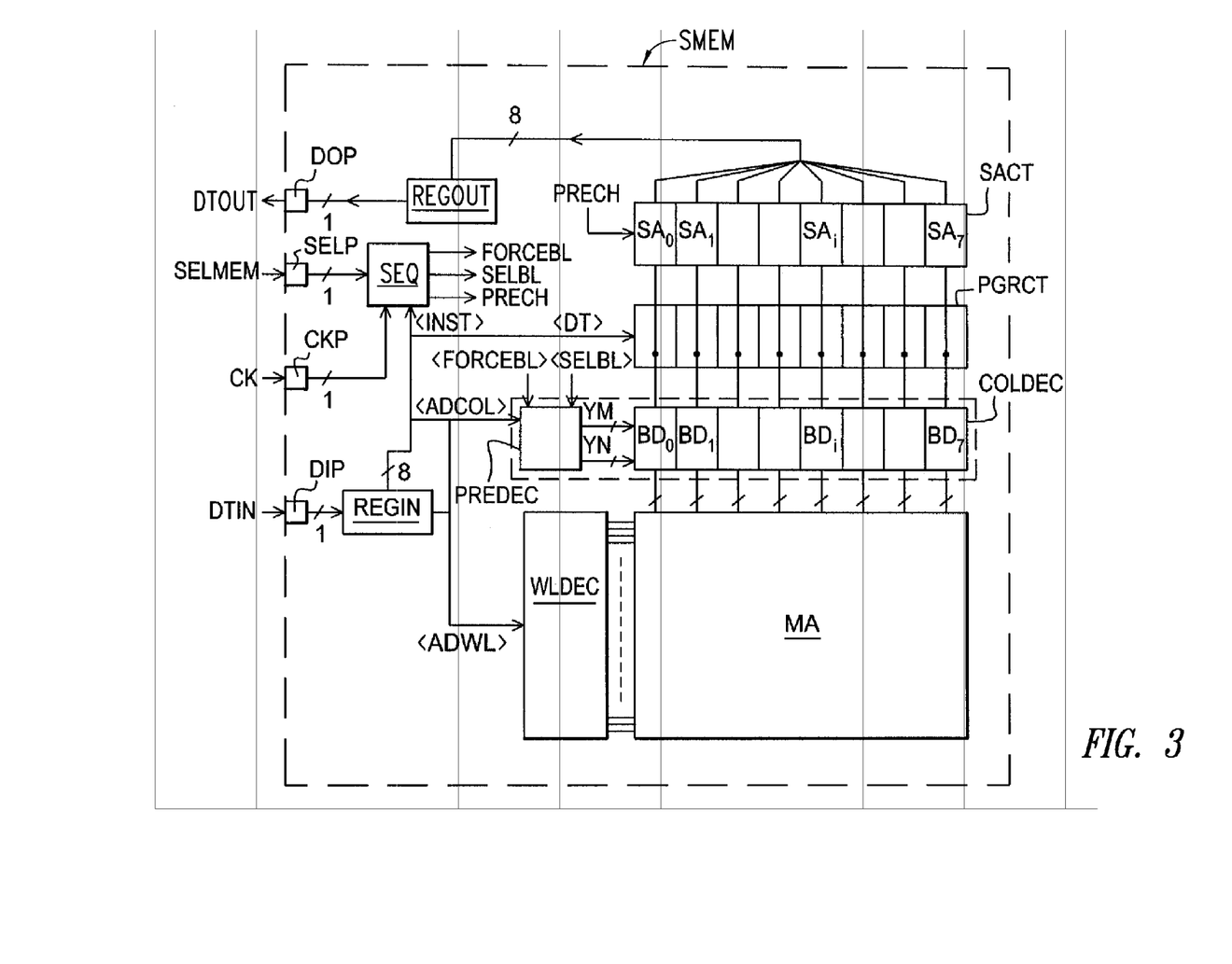
FIG. 3 represents, in block form, the general structure of a serial memory in which the method of the present invention is implemented.

FIG. 3 represents the structure of a serial memory SMEM, here of Flash type, integrated on a silicon chip having a Data In Pad DIP forming a serial input of the memory receiving data DTIN, a Data Out Pad DOP forming a serial output of the memory sending data DTOUT, a pad CKP forming an input of the memory receiving a clock signal CK, and a pad SELP forming an input of the memory receiving a signal SELMEM for selecting the memory. The memory SMEM comprises a memory array MA, a word line decoder WLDEC, a column decoder COLDEC, a programming circuit PGRCT, a sense amplifier circuit SACT, an input register REGIN of serial/parallel type, an output register REGOUT of parallel/serial type, and a sequencer SEQ that drives these various elements and executes read or write instructions. The serial input of the register REGIN is linked to the pad DTIN and its parallel output is linked to the sequencer SEQ, to the circuit PGRCT and to the decoders COLDEC, WLDEC, to respectively supply these elements with instruction codes INST, word line addresses ADWL, column addresses ADCOL, and data DT to be saved in the memory array. The sense amplifier circuit here comprises eight sense amplifiers $SA_i$ ($SA_0$, $SA_1$, ... $SA_7$) enabling an 8-bit word or byte to be read from the memory array. Each amplifier $SA_i$ is of the same structure as the one described above, and receives the signal PRECH that is supplied here by the sequencer SEQ. The decoder COLDEC comprises 8 decoding blocks BDi ($BD_0$, $BD_1$, ... $BD_7$), each decoding block $BD_i$ linking a sense amplifier $SA_i$ to a group of bit lines of the memory array MA, or column. The decoding blocks $BD_i$ are controlled by a column predecoder PREDEC receiving the address ADCOL and supplying predecoding signals YM, YN. The predecoder PREDEC may also receive a signal SELBL supplied by the sequencer, which activates the predecoding and causes the signals YM, YN to be supplied for a bit line to be selected by each of the decoding blocks $BD_i$.

According to the present invention, the sequencer SEQ also supplies the predecoder PREDEC, while a read address is being received at the input DTIN, with a signal FORCEBL which causes a modification of the selection signals YM, YN and forces each of the decoding blocks $BD_i$ to select two bit lines instead of one. As will be described in detail below, this signal FORCEBL is activated (i.e., is taken to an active value) when the sequencer SEQ has received a partial read address that does not yet enable the word designated by the complete address being received to be read, but which does enable, according to the present invention, the precharging of the bit lines having the same partial address to be started.

Figure 4:
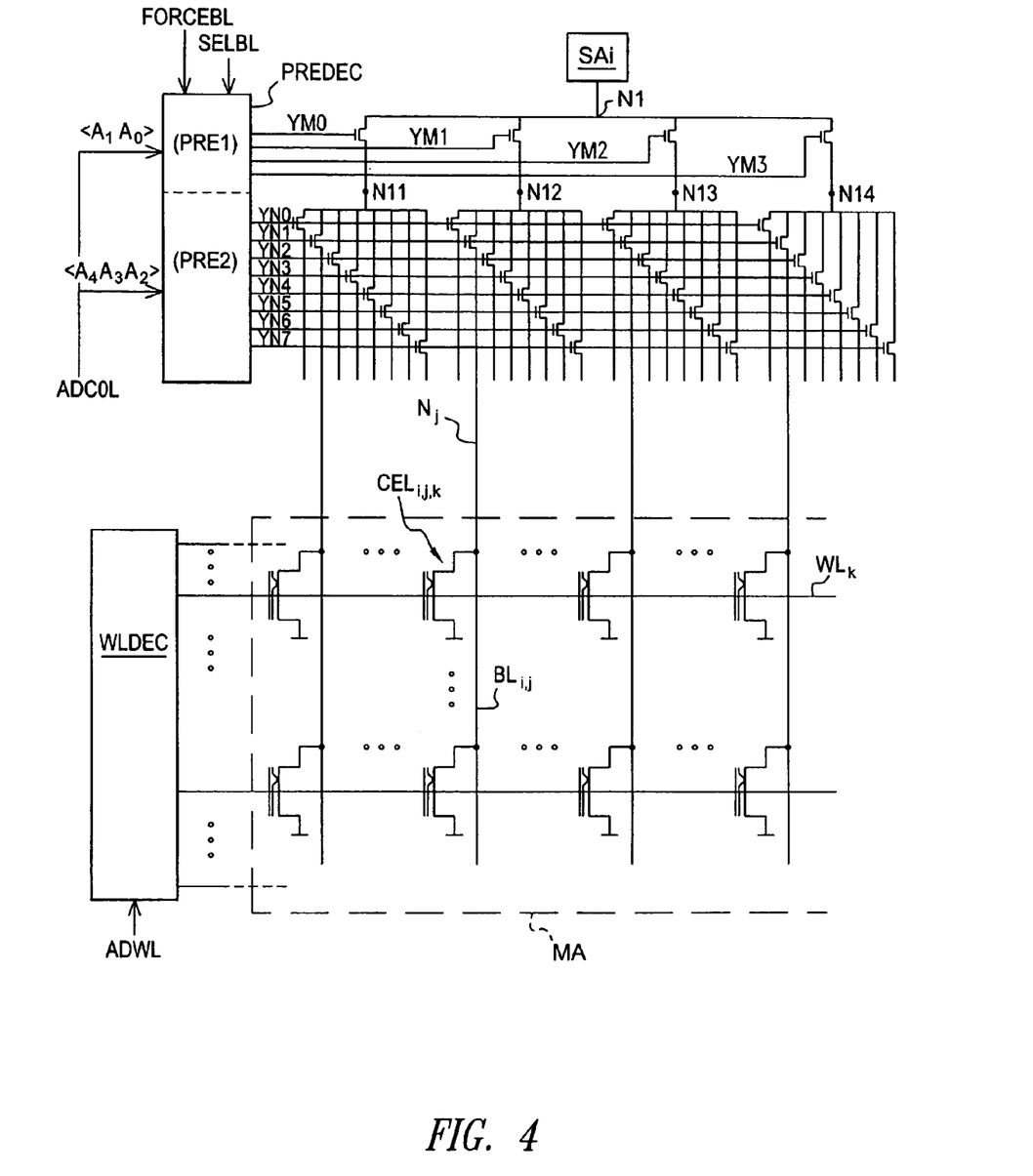
FIG. 4 represents the structure of a decoding block present in the serial memory of FIG. 3.

FIG. 4 illustrates an example embodiment of a decoding block $BD_i$. It is assumed here that the column address applied to the predecoder PREDEC comprises 5 address bits $A_4$, $A_3$, $A_2$, $A_1$, $A_0$, which corresponds to a memory array MA architecture comprising $2^5$ i.e., 32 bit lines per column of rank i. The predecoder PREDEC comprises a first predecoding block PRE1 which predecodes the address bits $A_1$, $A_0$ and supplies four predecoding signals YM0, YM1, YM2, YM3, and a second predecoding block PRE2 which predecodes the address bits $A_4$, $A_3$, $A_2$ and supplies eight predecoding signals YN7, YN6, YN5, YN4, YN3, YN2, YN1, YN0.

The decoding block $BD_i$ has the structure of a multiplexer and comprises n input nodes Nj (ranging from 1 to n, n being equal, in this example, to 32) each linked to a bit line $BL_{i,j}$ of the same rank j. The input nodes $N_j$ are arranged in four sub-groups of eight input nodes each. All of the input nodes in a sub-group are linked to an intermediate node, respectively N11, N12, N13, N14, through selection transistors each driven by one of the signals YN7 to YN0. Each node N11 to N14 is linked to an output node N1 through a transistor driven by one of the signals YM0 to YM3. The output node N1 of the decoding block $BD_i$ is linked to the sense amplifier $SA_i$ of corresponding rank.

This decoding block $BD_i$ structure is provided in previous practices to link one bit line to the sense amplifier SAi, to read a memory cell linked to the bit line. According to the present invention, the structure of the predecoding block PRE1 is modified to enable two bit lines of the same partial address to be simultaneously selected, so as to simultaneously precharge these lines with the amplifier SAi.

Figure 5:
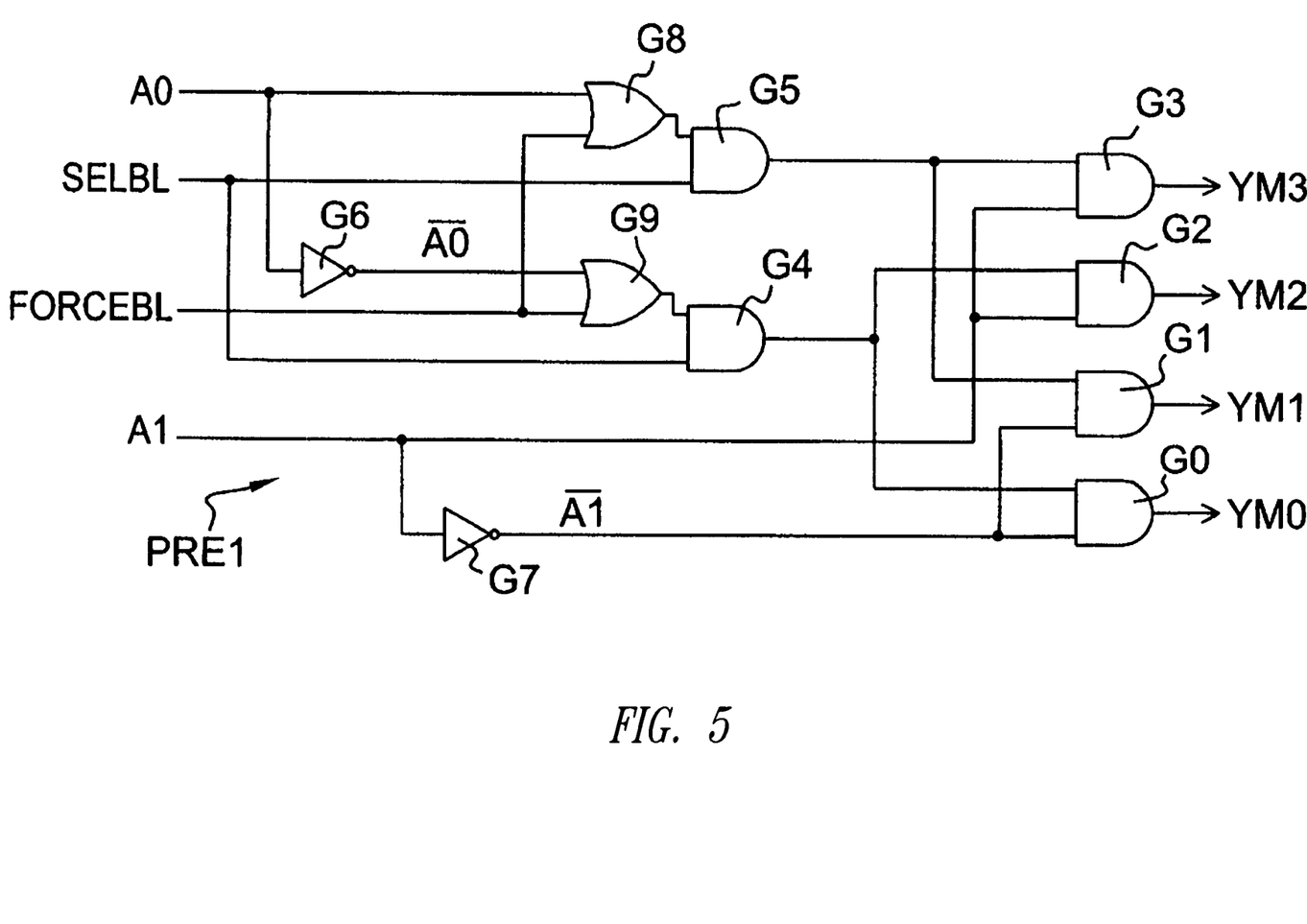
FIG. 5 is a logic diagram of one part of a column predecoder present in the serial memory of FIG. 3, FIGS. 6A-6E illustrate the implementation of the method of the present invention in the serial memory of FIG. 3 and respectively represent a clock signal, an incoming data signal, a precharge signal, a bit line selection signal and a predecoder forcing signal.

FIG. 5 illustrates an example embodiment of the predecoding block PRE1 enabling the selection of two bit lines at the same time to be forced when the signal FORCEBL is on 1. Said block PRE1 comprises six AND gates with two inputs G0, G1, G2, G3, G4, G5, two inverting gates G6, G7 and two OR gates with two inputs G8, G9.

The gate G8 receives the address bit A0 and the signal FORCEBL. The gate G6 receives the address bit A0 and supplies an inverted bit/A0. The gate G7 receives the address bit A1 and supplies an inverted bit/A1. The gate G9 receives the bit/A0 and the signal FORCEBL. The gate G5 receives the output of the gate G8 and the signal SELBL. The gate G4 receives the output of the gate G9 and the signal SELBL. The gate G0 receives the inverted bit/A1 and the output of the gate G4 and supplies the signal YM0. The gate G1 receives the inverted bit/A1 and the output of the gate G5 and supplies the signal YM1. The gate G2 receives the bit A1 and the output of the gate G4 and supplies the signal YM2. The gate G3 receives the bit A1 and the output of the gate G5 and supplies the signal YM3.

Thus, the predecoding signals YM0, YM1, YM2, YM3 are forced to 0 when the signal SELBL is on 0 and have the following values when the signal SELBL is on 1, where "*" indicates an AND operation and "+" indicates an OR operation:

$YM0=/A1*(/A0+FORCEBL)$ $YM1=/A1*(A0+FORCEBL)$ $YM2=A1*(/A0+FORCEBL)$ $YM3=A1*(A0+FORCEBL)$

It follows that the predecoding signals have the following values when the signal FORCEBL is on 0 and SELBL is on 1:

$YM0=/A1*/A0$ $YM1=/A1*A0$ $YM2=A1*/A0$ $YM3=A1*A0$ and have the following values when the signal FORCEBL is on 1:

$YM0=/A1$ $YM1=/A1$ $YM2=A1$ $YM3=A1$

Therefore, when the signal FORCEBL is on 0, only one of the predecoding signals YM0 to YM3 is on 1 for a determined combination of values of the two least significant address bits A1 and A0. On the other hand, when the signal FORCEBL is on 1, two predecoding signals YM0, YM1 or YM2, YM3 are simultaneously on 1 for a determined value of the penultimate address bit A1, which causes two bit lines having the same partial address (i.e., here two bit lines having the same column address bits A4, A3, A2, A1 and only being distinguished by different values of the least significant address bit A0) to be selected by the decoding block $BD_i$ (See FIG. 4).

Figure 6A:
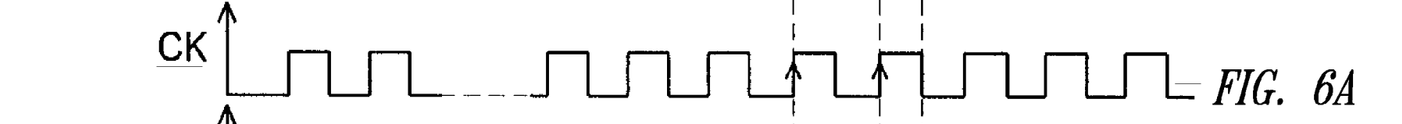
Figure 6B:
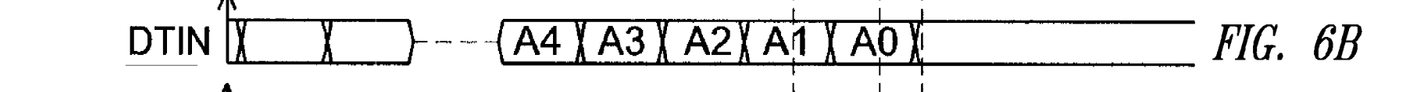
Figure 6C:
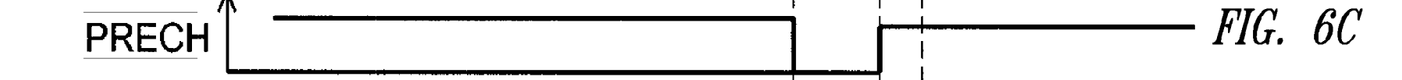
Figure 6D:
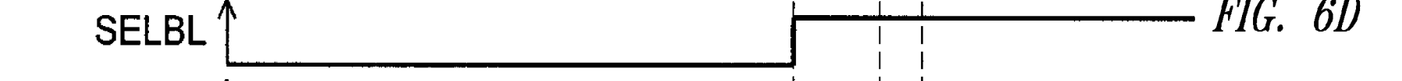
Figure 6E:
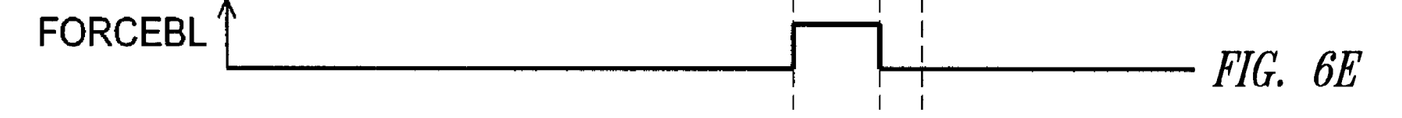

FIGS. 6A-6E are timing diagrams showing the control of a read operation by the sequencer SEQ. FIG. 6A represents the clock signal CK received at the input CKP (See FIG. 3), FIG. 6B represents the data DTIN received at the input DIP, FIG. 6C represents the signal PRECH, FIG. 6D represents the signal SELBL and FIG. 6E represents the signal FORCEBL. It is assumed that the memory has already received a read instruction in the form of serial data as well as the most significant address bits forming the address of the word line ADWL in which the word to be read is located, and that it is in the course of receiving the least significant address bits A4, A3, A2, A1, A0 forming the column address of the word to be read.

At an instant $t_0$ corresponding to the rising edge of a pulse of the clock signal CK, the penultimate address bit A1 is received such that the partial address of the word to be read, here formed by the complete address minus the last address bit A0, is known. At this instant, the sequencer SEQ puts the signal SELBL to 1 to activate the column decoder and puts the signal PRECH to 0 to initiate a precharge phase. Simultaneously, the signal FORCEBL is put to 1 such that, in each column of the memory array MA, two bit lines are precharged by the corresponding sense amplifier $SA_i$. These bit lines have the same partial address and their complete addresses are only distinguished by different address bits A0.

At an instant $t_1$ corresponding to the next rising edge of the clock signal CK, the last address bit A0 is received and the complete address of the word to be read is known. At this instant, the sequencer SEQ puts the signal FORCEBL back to 0, such that one bit line designated by the complete column address ADCOL is selected in each column of the memory array MA. The other bit lines, i.e., those that were also subject to the precharge phase, are no longer linked to the sense amplifiers. Simultaneously, the signal PRECH is put back to 1 to stop the precharge phase. A binary word is then available at the output of the sense amplifier circuit SACT (each sense amplifier $SA_i$ supplying one bit of the word) and is transferred by the sequencer SEQ into the output register REGOUT. At an instant $t_2$ corresponding here to the falling edge of the same pulse of the clock signal CK, the first data bit is supplied by the register REGOUT at the output DOP (timing diagram not represented, Cf. FIG. 1C by analogy).

Figure 7:
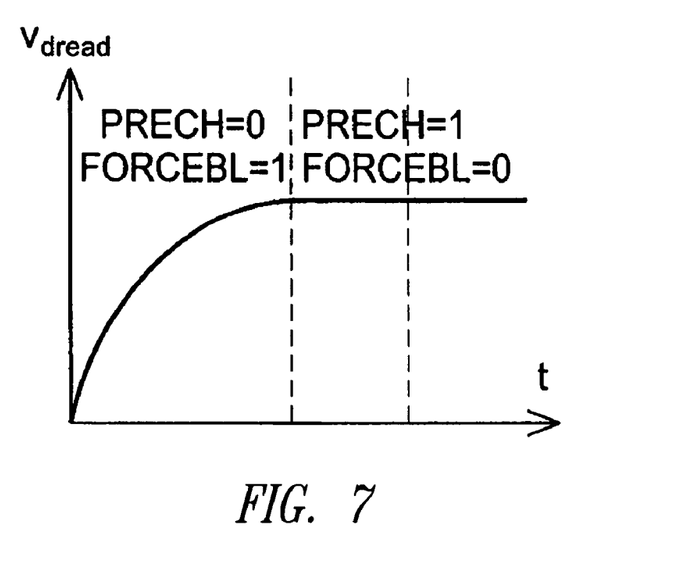
FIG. 7 represents a curve illustrating the establishment of a read voltage on a bit line according to one embodiment of the method of the present invention.

FIG. 7 illustrate the curve of the read voltage $V_{dread}$ during the precharge and reading phases. During the precharge phase (FORCEBL=1, PRECH=0) the voltage $V_{dread}$ is applied to two bit lines at the same time (in each column) and is assumed to be stabilized at the beginning of the actual reading phase (FORCEBL=0, PRECH=1) which then only concerns a single bit line per column.

Figure 8:
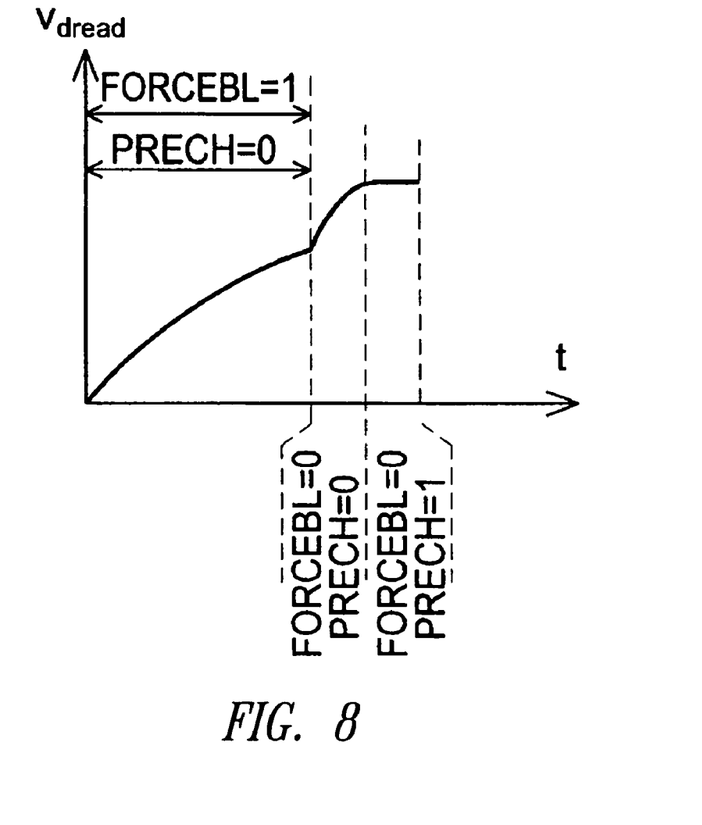
FIG. 8 represents a curve illustrating the establishment of a read voltage on a bit line according to an alternative embodiment of the method of the present invention.

In an alternative embodiment, the precharge phase is maintained after the complete address of the bit line is known, if the precharging of the bit line is not finished. In this case, when the signal FORCEBL is put back to 0 at the instant $t_1$, the signal PRECH is left on 0 for a lapse of time sufficient to finish the precharging of the remaining selected bit line. This alternative embodiment is illustrated in FIG. 8, which represents the curve of the voltage $V_{dread}$ during the precharge and reading phases. A first precharge phase can be distinguished that concerns two bit lines (FORCEBL=1, PRECH=0), then an additional precharge phase (FORCEBL=0, PRECH=0) that only concerns the bit line designated by the complete address received, then the actual reading phase (FORCEBL=0, PRECH=1). During the additional precharge phase, all of the precharge current that the sense amplifier $SA_i$ can supply is applied to the remaining selected bit line, and the voltage $V_{dread}$ increases more rapidly than during the first precharge phase.

It will be understood by those skilled in the art that various alternatives and improvements of the present invention are possible. The description above is of an example of implementation of the method in which each sense amplifier $SA_i$ precharges two bit lines upon receiving the penultimate address bit A1. Each sense amplifier $SA_i$ can also precharge four bit lines upon receiving the address bit A2 (instead of A1), eight bit lines upon receiving the address bit A3, etc. if it is desirable to step up the precharge-ahead process. As a new, partial address that is more complete than the previous partial address is known every time a new address bit is received, it is preferable to disconnect the bit lines that are no longer concerned by the new partial address so as to "relieve" the sense amplifiers of an excessive capacitive load and thus accelerate the precharge process and the increase in the voltage $V_{dread}$.

Various alternatives of the means for implementing the present invention are also possible. The description above is of a predecoding decoder having a classical structure in which gates G8, G9 are added to force the predecoding signals to select two bit lines. However, the present invention applies to any known type of decoder architecture, with or without a predecoding stage.

The method of the present invention, applied to a serial memory, forms a precharge-ahead method rather than a read-ahead method. However, it can be combined with a classical read-ahead method to combine the advantages of each method. Thus, for example 16 sense amplifiers can be provided to perform a read-ahead comprising the following steps:

upon receiving the bit A2, precharging 32 bit lines by means of the 16 sense amplifiers, in accordance with the method of the present invention, upon receiving the bit A1, reading (possibly comprising an additional precharge phase) two binary words of 8 bits each having the same partial address, by means of the 16 sense amplifiers, and upon receiving the bit A0, selecting the word designated by the complete address out of the two words read ahead, and supplying the word bit by bit on the serial output of the memory.

In this example, the method of the present invention is implemented upon receiving the bit A2 and the classical read-ahead method is implemented upon receiving the bit A1. Various other alternative embodiments of the method of the present invention can be provided.

Generally speaking, the method of the present invention is applicable to any type of serial access memory comprising a memory array comprising bit lines requiring a precharge phase, particularly EEPROM, FLASH, ROM memories, etc.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for reading memory cells using sense amplifiers, the memory cells being linked to bit lines, the method comprising:

upon receiving a partial read address from which at least one least significant bit is missing from a complete address, precharging bit lines addressed by the partial read address by using a sense amplifier to precharge at least two bit lines; and upon receiving the complete address, stopping precharging bit lines not addressed by the complete address; and reading a memory cell addressed by the complete address, the sense amplifier precharging at least two bit lines, then reading one and only one memory cell on one of the at least two bit lines that have been precharged in the precharging step.

2. The method according to claim 1 wherein each sense amplifier is linked to a group of bit lines through a column decoder, and wherein the column decoder is used to link each sense amplifier to at least two bit lines during the precharging, then, during the reading, to link each sense amplifier to one and only one bit line.

3. The method according to claim 2 wherein the column decoder comprises decoder blocks driven by predecoding signals supplied by a predecoder stage receiving a column address, each decoder block linking a sense amplifier to a group of bit lines, the method comprising forcing the predecoder, during the precharging, to supply predecoding signals, so that each decoder block links a sense amplifier to at least two bit lines, then, during the reading, releasing the predecoder so that each column decoder block links a sense amplifier to one and only one bit line.

4. The method according to claim 1 wherein at least one bit line addressed by the complete address continues to be precharged after the complete address has been received, before beginning reading the memory cell addressed by the complete address.

5. The method according to claim 3, comprising the following steps:

upon receiving a first partial read address from which at least two least significant bits are missing from a complete address, precharging the bit lines addressed by the first partial read address; and upon receiving a next address bit, forming a second partial read address, and stopping precharging bit lines that are not addressed by the second partial read address, so as to reduce a capacitive load seen by the sense amplifiers and to accelerate precharging bit lines remaining selected by the second partial read address.

6. A memory, comprising:

bit lines;

memory cells linked to the bit lines;

sense amplifiers;

a column decoder linking each sense amplifier to a group of the bit lines, wherein the sense amplifiers are structured to precharge the bit lines to which the memory cells to be read are linked, and are structured to read the memory cells;

means for forcing the decoder, during a precharge phase, to link each sense amplifier to at least two bit lines of a same column, then, during a reading phase, releasing the decoder so that the decoder links each sense amplifier to one and only one bit line of the column.

7. The memory according to claim 6 wherein the column decoder comprises decoder blocks driven by predecoding signals supplied by a predecoder stage receiving a column address, each decoder block linking a sense amplifier to a group of bit lines, and comprising means for forcing the predecoder, in precharge phase, to supply predecoding signals of determined value, so that each column decoder block links a sense amplifier to at least two bit lines, then, during the reading phase, releasing the predecoder so that each decoder block links a sense amplifier to one and only one bit line.

8. The memory according to claim 6, comprising a serial input and receiving a read address bit by bit, and means for:
upon receiving a partial read address from which at least one least significant bit is missing from a complete address, precharging bit lines addressed by the partial read address in each group of bit lines; and
upon receiving the complete address, stopping precharging bit lines not addressed by the complete address, then reading the memory cells addressed by the complete address.

9. The memory according to claim 8, arranged for continuing to precharge bit lines addressed by the complete address upon receiving the complete address, before triggering reading the memory cells designated by the complete address.

10. The memory according to claim 6, comprising means for:
upon receiving a first partial read address from which at least two least significant bits are missing from a complete address, precharging bit lines addressed by the first partial read address in each group of bit lines; and
upon receiving a next address bit, forming a second partial read address, and stopping precharging bit lines that are not addressed by the second partial read address.

11. A method for reading a memory cell, comprising:
obtaining a portion of a complete memory address, the portion addressing a plurality of memory cells;
precharging a plurality of bit lines with a sense amplifier, wherein each bit line is coupled to one of the memory cells;
obtaining the complete memory address;
selecting one of the bit lines based on the complete memory address; and
reading, using the sense amplifier, the memory cell coupled to the selected bit line.

12. The method of claim 11, further comprising:
de-coupling the sense amplifier from each of the bit lines except the selected bit line after obtaining the complete memory address.

13. The method of claim 12, further comprising continuing to precharge the selected bit line after obtaining the complete memory address.

14. The method of claim 11, further comprising:
obtaining a second portion of the complete memory address, the second portion addressing a subset of the memory cells;
continuing to precharge the bit lines coupled to the memory cells addressed by the second portion; and
discontinuing the precharging of bit lines coupled to memory cells not addressed by the second portion.

15. An apparatus for reading a memory cell, comprising:
a plurality of bit lines, wherein each bit line is coupled to one of a plurality of memory cells addressed by a portion of a complete memory address;
a charge circuit integrated into a sense amplifier configured to precharge the bit lines only after the portion of the complete memory address is received;
a pre-decoder configured to provide a plurality of signals to indicate that the charge circuit should precharge two or more bit lines addressed by the portion of the complete memory address;
a decoder configured to select one of the bit lines based on the complete memory address; and
a sense amplifier configured to read the memory cell coupled to the selected bit line.

16. The apparatus of claim 15, wherein the charge circuit is de-coupled from each of the bit lines except the selected bit line after the decoder obtains the complete memory address.

17. The apparatus of claim 16, wherein the charge circuit continues to precharge the selected bit line after the decoder obtains the complete memory address.

18. The apparatus of claim 15, wherein:
the complete memory address comprises a predetermined number of bits; and
the portion of the complete memory address comprises each of the bits of the complete memory address except the least significant bit.

19. The apparatus of claim 15, wherein the decoder is further configured to couple one or more of the bit lines to the integrated charge circuit and sense amplifier by multiplexing the bit lines.

20. A method to precharge a memory, comprising:
starting a precharge of a plurality of bit lines after a portion of a complete address is decoded such that the plurality of bit lines are concurrently precharging;
decoding an additional portion of the complete address;
terminating the precharge of bit lines which are determined to not be selected by the additional portion of the complete address; and
continuing the precharge of remaining bit lines of the plurality of bit lines until the complete address has been decoded and at least one bit line of the remaining bit lines is being precharged.

21. The method of claim 20 wherein the complete address is received serially.

22. The method of claim 21 wherein starting a precharge includes applying a voltage potential to a node of a predecoder circuit and terminating the precharge includes removing the voltage potential from the node of the predecoder circuit.

23. The method of claim 20, further comprising:
coupling a sense amplifier to each bit line being precharged;
turning on a precharge transistor in the sense amplifier; and
supplying a precharge current via the precharge transistor to each bit line coupled to the sense amplifier.

24. The method of claim 23 wherein coupling the sense amplifier to each bit line being precharged comprises:
receiving a first signal at a first node of a predecoder logic circuit;
receiving at least two address bits at address nodes of the predecoder logic circuit;
applying a first output signal from the predecoder logic circuit to a gate of a first transistor, wherein a first source/drain of the first transistor is coupled to the sense amplifier and a second source/drain of the first transistor is coupled to one of plurality of bit lines; and
applying a second output signal from the predecoder logic circuit to a gate of a second transistor, wherein a first source/drain of the second transistor is coupled to the sense amplifier and a second source/drain of the second transistor is coupled to another of the at least two bit lines.

25. The method of claim 20 wherein terminating the precharge of bit lines includes decoupling one half of the plurality of bit lines that were continuing to be precharged before the additional portion of the complete address was decoded.

26. A memory, comprising:
a register operable to receive an address;
a plurality of bit lines;
a precharge circuit coupled to the plurality of bit lines;
a plurality of switches, each switch coupled between the precharge circuit and at least one bit line of the plurality of bit lines, each switch operable to enable precharging of the at least one bit line when the switch is enabled and further operable to terminate precharging of the at least one bit line when the switch is disabled; and
a predecoder circuit operable to enable at least two of the plurality of switches after a partial address is decoded and further operable to disable at least one previously enabled switch after at least one additional bit of the address is decoded.

27. The memory of claim 26 wherein the predecoder circuit is further operable to disable previously enabled switches as additional bits of the address are decoded until only a single switch is enabled that corresponds to the address.

28. The memory of claim 26 wherein the register is operable to receive the address as a serial stream of address bits.

29. The memory of claim 26 wherein each switch of the plurality of switches is configured to be enabled by application of a voltage potential to a gate of the switch and each switch of the plurality of switches is further configured to be disabled by removal of the voltage potential from the gate of the switch.

30. The memory of claim 26 wherein the predecoder circuit includes a plurality of logic gates and the plurality of logic gates are configured to receive at least two address bits of the address.

31. The memory of claim 30 wherein the plurality of logic gates are further configured to receive at least one signal configured to indicate that a plurality of bit lines should be concurrently precharged.

32. The memory of claim 26 wherein the memory is an electrically erasable and programmable memory.

33. The memory of claim 26, further comprising:
a plurality of memory cells formed as an array, each memory cell having a floating-gate transistor with a gate, a source, and a drain;
a plurality of word lines that are formed by joining together the gates of a first group of floating-gate transistors; and
wherein the plurality of bit lines are formed by joining together the drains and sources of a second group of adjacent floating-gate transistors.

34. A memory, comprising:
a register operable to receive a portion of a complete address and further operable to receive the complete address;
a plurality of bit lines;
a precharge circuit;
a plurality of switches, each switch coupled between the precharge circuit and one bit line of the plurality of bit lines, each switch operable to selectively couple or decouple the precharge circuit with the corresponding bit line;
a predecoder circuit operable while the complete address is being decoded to enable switches corresponding to the portion of the complete address and further operable to disable switches that do not correspond to the portion of the complete address until only a single switch is enabled that corresponds to the complete address.

35. The memory of claim 34 wherein the complete address has n bits and the portion of the complete address has n−1 bits.

36. The memory of claim 34 wherein the predecoder circuit operable to disable switches that do not correspond to the portion of the complete address is further operable to iteratively disable the switches as subsequent bits of the complete address are decoded.

37. The memory of claim 34 wherein the register receives the portion of the complete address and the complete address as a serial stream of address bits.

38. The memory of claim 34 wherein each switch of the plurality of switches is enabled by applying a voltage potential to a gate of the switch and each switch of the plurality of switches is disabled by removing the voltage potential from the gate of the switch.

39. The memory of claim 34, further comprising a precharge transistor in the sense amplifier operable to supply a precharge current to each bit line coupled to the sense amplifier.

40. The memory of claim 34 wherein the pre-decoder circuit includes a plurality of logic gates and the plurality of logic gates are configured to receive at least two address bits of the complete address.

41. The memory of claim 40 wherein the plurality of logic gates are further configured to receive at least one signal configured to indicate that a plurality of bit lines should be concurrently precharged.

42. The memory of claim 34 wherein the memory is an electrically erasable and programmable memory.

* * * * *